(12) United States Patent
Karman et al.

(10) Patent No.: US 8,205,999 B2
(45) Date of Patent: Jun. 26, 2012

(54) MULTI VIEW DISPLAY DEVICE

(75) Inventors: Gerardus Petrus Karman, 's-Gravenhage (NL); Marc Wilhelmus Gijsbert Ponjee, Eindhoven (NL); Frank Anton Van Abeelen, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 466 days.

(21) Appl. No.: 11/917,565

(22) PCT Filed: Jun. 8, 2006

(86) PCT No.: PCT/IB2006/051824
§ 371 (c)(1),
(2), (4) Date: Aug. 1, 2008

(87) PCT Pub. No.: WO2006/134519
PCT Pub. Date: Dec. 21, 2006

(65) Prior Publication Data
US 2009/0213568 A1 Aug. 27, 2009

(30) Foreign Application Priority Data

Jun. 14, 2005 (EP) .................................... 05105218

(51) Int. Cl.
*G09F 13/08* (2006.01)
(52) U.S. Cl. ............ 362/97.1; 362/464; 362/489; 345/4
(58) Field of Classification Search .................. 362/97.1, 362/464, 489; 345/4–6, 76, 82
See application file for complete search history.

(56) References Cited

U.S. PATENT DOCUMENTS

| | | | | |
|---|---|---|---|---|
| 3,240,112 A * | 3/1966 | Erban | ............................... | 353/39 |
| 4,578,527 A * | 3/1986 | Rancourt et al. | ............... | 136/256 |
| 4,600,309 A * | 7/1986 | Fay | ................................. | 356/401 |
| 5,582,474 A * | 12/1996 | Van Order et al. | ............. | 362/490 |
| 6,157,042 A * | 12/2000 | Dodd | ............................... | 257/21 |
| 6,680,570 B2 * | 1/2004 | Roitman et al. | ............... | 313/506 |
| 7,321,464 B2 * | 1/2008 | Ouderkirk et al. | ........ | 359/489.06 |

(Continued)

FOREIGN PATENT DOCUMENTS

EP          0999088          10/1999
(Continued)

OTHER PUBLICATIONS

Tsutsui, et al., "Sharply directed emission in organic electroluminescent diodes with an optical-microcavity structure," Appliied Physics Letters, vol. 65, No. 15, Oct. 10, 1994.*

(Continued)

*Primary Examiner* — Jong-Suk (James) Lee
*Assistant Examiner* — Stanley Weinberg (57) ABSTRACT

A multi view display comprising a light emitting element having an optical cavity formed by a first and a second reflecting layer, at least said second reflecting layer being semi-transparent, and a light emitting layer arranged between said reflecting layers, wherein said optical cavity is designed so that light emitted in at least two preferred viewing directions has a higher intensity than light emitted in other directions. The invention is based on interference phenomena in the optical cavity, making it possible to realize a light emitting element that intrinsically emits more light in the preferential viewing directions than in other directions. This emission profile makes the light emitting element very useful in a multi view display, reducing the problems of cross talk.

22 Claims, 5 Drawing Sheets

U.S. PATENT DOCUMENTS

| | | | |
|---|---|---|---|
| 7,638,941 B2 * | 12/2009 | Cok | 313/506 |
| 2004/0155576 A1 * | 8/2004 | Tyan et al. | 313/504 |
| 2004/0217702 A1 | 11/2004 | Garner | |
| 2005/0001787 A1 | 1/2005 | Montgomery | |
| 2005/0046951 A1 | 3/2005 | Sugihara et al. | |
| 2005/0073228 A1 * | 4/2005 | Tyan et al. | 313/110 |
| 2005/0212005 A1 * | 9/2005 | Misra et al. | 257/98 |
| 2006/0006795 A1 * | 1/2006 | Strip | 313/504 |
| 2006/0038752 A1 * | 2/2006 | Winters | 345/76 |
| 2008/0164812 A1 * | 7/2008 | Tsai et al. | 313/509 |

FOREIGN PATENT DOCUMENTS

| | | |
|---|---|---|
| GB | 2403367 | 11/2004 |
| GB | 2405517 | 3/2005 |
| GB | 2405542 | 3/2005 |
| GB | 2405543 | 3/2005 |
| GB | 2405546 | 3/2005 |
| JP | 200577437 A | 3/2005 |
| WO | 2004016460 | 2/2004 |
| WO | 2006017118 | 2/2006 |

OTHER PUBLICATIONS

Tokito et al., "Microcavity organic light-emitting diodes for strongly directed pure red, green, and blue emissions," Journal of Applied Physics, vol. 86, No. 5, Sep. 1, 1999.*

Takada N et al: "Control of Emission Characteristics in Organic Thin-Film Electroluminescent Diodes Using an Optical-Microactivity Structure" Applied Physics Letters, AIP, American Institute of Physics, Melville, NY, US, vol. 63, No. 15 Oct. 11, 1993, pp. 2032-2034.

Neyts: "Simulation of Light Emission From Thin-Film Microcavities" J. Opt. Soc. Am. A vol. 15, No. 4, Apr. 1998.

* cited by examiner

MULTI VIEW DISPLAY DEVICE

This application is the National Stage of international Application No. PCT/IB06/051824 filed on Jun. 8, 2006, which claims the priority to European Patent Application Ser. No. 05105218.1 filed on Jun. 14, 2005.

The present invention relates to multi view displays, i.e. displays arranged to simultaneously provide different image information depending on from which direction the display is regarded.

Such multi view displays are useful e.g. in automotive applications, where they can be mounted on the midconsole of a car and display different images for the driver and for the passenger.

A special case (dual view) is a display which has a low emission in the direction of the normal of the display, while providing a normal image at oblique angles (e.g. +/−30 degrees) to the left and right.

Such a dual view display can be constructed in several ways. A well known way is by introducing a barrier layer on top of a conventional display (e.g. an LCD). The barrier layer consists of a horizontal array of slits aligned in the vertical direction. These apertures allow light from one display pixel to be visible under viewing angles to the left of the display normal, and light from its neighbor pixel to be visible only under right oblique angles. In this way two independent images can be displayed: one to the left, and one to the right. An example of such a display is given GB 2403367.

However, in directions close to the display normal, both views will be visible, a phenomenon known as "cross talk". An observer regarding the display from this angle will see the image of view1 and view2 merged into one image. This is undesirable, and can in automotive applications be a dangerous situation, as it can distract the driver.

To solve this problem, either the backlight needs to be modified so that it emits only into desired directions, or the display itself, so that it prevents transmission of light into undesired directions. Two possible solutions have been proposed:

a double color filter acting both as color filter and as barrier layer. This solves the problem but requires the use of new optical components that need to be aligned with existing components and is therefore expected to be expensive.

a specially designed LC mode that has the property of absorbing the light in the forward direction. By combining such an LCD with the above described barrier layer, one has solved the cross talk problem. However, this solution requires the use of a specially designed LCD.

It is an object of a first aspect of the present invention to overcome or at least reduce these problems, and to provide a dual view display with little or no cross talk.

This and other objects are achieved by a multi view display comprising a light emitting element including an optical cavity formed by a first and a second reflecting layer, at least said second reflecting layer being semi-transparent, and a light emitting layer arranged between said reflecting layers, wherein said optical cavity is designed so that light emitted in at least two preferred viewing directions has a higher intensity than light emitted in other directions. As one example, light emitted along a normal to the display has lower intensity than light emitted at a viewing angle with respect to said normal.

For the purpose of the present invention, the term intensity is used as the light intensity at one wavelength in case of (near) monochromatic emission, or as the integrated light intensity over relevant wavelengths involved in case of non-monochromatic light.

The invention is based on resonance phenomena in the optical cavity, making it possible to realize a light emitting element that intrinsically emits more light in the preferential viewing direction than in other directions. This emission profile makes the light emitting element very useful in a multi view display, reducing the problems of cross talk.

The desired emission profile is realized by tuning the optical properties of the optical cavity. The principal effect of the optical cavity on the light emission is to redistribute the photon density of states such that only certain wavelengths, which correspond to allowed cavity modes, are emitted in a given direction.

According to a preferred embodiment, the light emitting layer comprises an electroluminescent material. For example, the light emitting element can be an organic light emitting diode (OLED), based on e.g. small molecule organics (smOLED) or polymer organics (pLED).

A ratio between light intensity emitted along the normal and light intensity emitted in a given plane on both sides of the normal and at a predefined viewing angle with respect to said normal, can preferably exceed 2, and even more preferably exceed 5. A ratio around 13 has been shown to provide satisfactory results.

Preferably, emitted light intensity as a function of viewing angle in said plane has a maximum essentially in said viewing angle, and a minimum essentially in the normal direction. Such a design will increase the mentioned ratio.

The optical cavity preferably includes at least one layer having an index of refraction with a real part lower than 1.5, preferably lower than 1.45, and most preferably lower than 1.4. Such a low refraction index has been found to present advantageous conditions for designing the cavity.

The second, semi-transparent reflective layer preferably has a reflective coefficient larger than 0.5, preferably larger than 0.7 and most preferably larger than 0.8. It can be shown that such values for the reflective coefficients provide advantageous conditions for designing the cavity. A larger reflective coefficient results in an emission profile with a more accentuated peak, thus increasing the mentioned ratio. The first reflective layer is preferably a perfect reflector, i.e. reflective coefficient equal to one.

The light emitting material is preferably adapted to emit light within a narrow wavelength range, typically less than 100 nm and preferably less than 50 nm. In a special case, the light emitting material is adapted to emit monochromatic light. This makes design according to the above criteria easier to implement. However, the invention is by no means limited to monochromatic light, and the required light intensity distribution can be accomplished also with a spectral distribution of light. In this case, the above equations must be considered in the wavelength domain, and compared to the emitted spectrum.

The light emitting element can be adapted to act as a backlight, and the display can then further comprise a light modulating panel (e.g. an LCD) for modulating light emitted from said backlight. Alternatively, the light emitting element is constructed with a patterned pixel structure to form an addressable display panel controllable by a display driver.

It is an object of a second aspect of the present invention to improve the perpendicular viewing angle range of a multi view display, e.g. the vertical viewing angle range in a multi view display with horizontally differentiated views.

This aspect of the invention relates to a multi view display comprising means for generating multi view images, and an asymmetric diffuser arranged between the image generating means and a viewer, which asymmetric diffuser is adapted to scatter light essentially only in one direction. Such a diffuser has the effect to extend the emission profile in one direction, making it more elongated. By orienting the asymmetric diffuser correctly, this provides an improved angular viewing angle in a direction perpendicular to the angular spread of the multiple views of the display. If, for example, the display is arranged to have different viewing zones in the horizontal direction, the asymmetric diffuser can be oriented to extend the emission profile in the vertical direction, thus allowing greater variations in the vertical position of the viewer.

The second aspect of the invention can advantageously be combined with the first aspect, i.e. the means for generating multi view images can comprise an optical cavity. As light emitted from the optical cavity typically is circular symmetric, the asymmetric diffuser thus significantly improves the angular viewing range.

This and other aspects of the present invention will now be described in more detail, with reference to the appended drawings showing a currently preferred embodiment of the invention.

FIG. 2b shows a diagram of emitted light intensity as a function of viewing angle corresponding to the performance in FIG. 2a.

Figure 1:
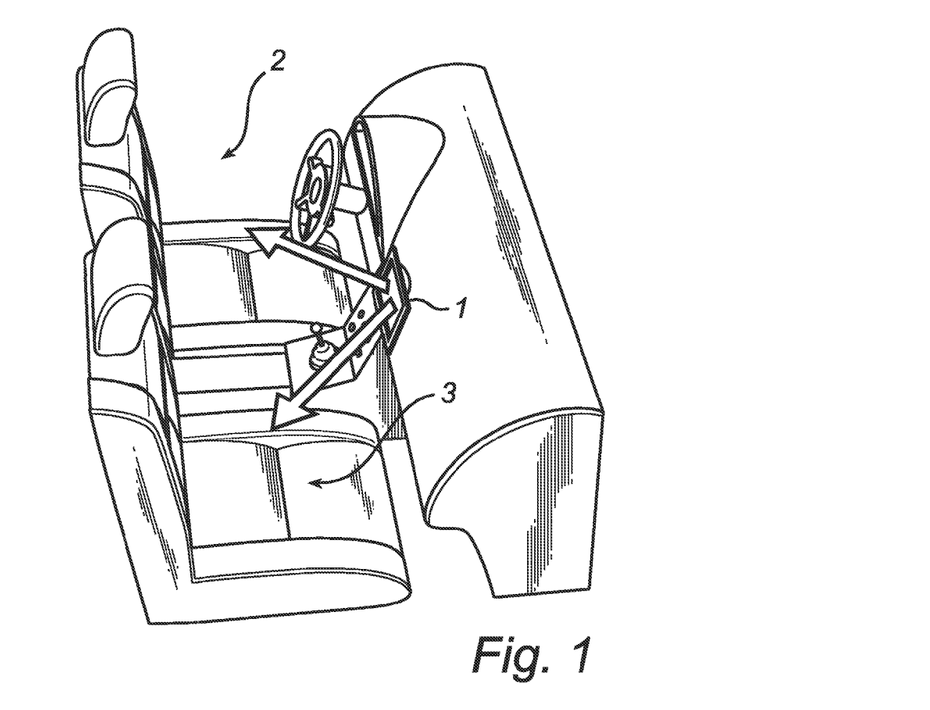
FIG. 1 illustrates how a dual view display can be useful in a car.
Figure 2A:
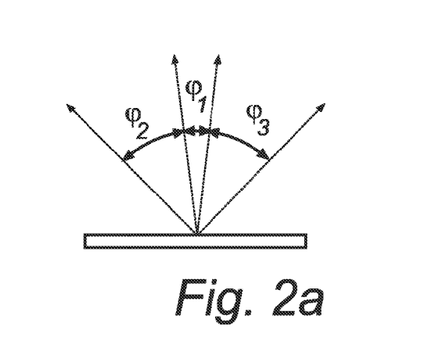
FIG. 2a illustrates the desired viewing angle ranges for a dual view display.
Figure 2B:
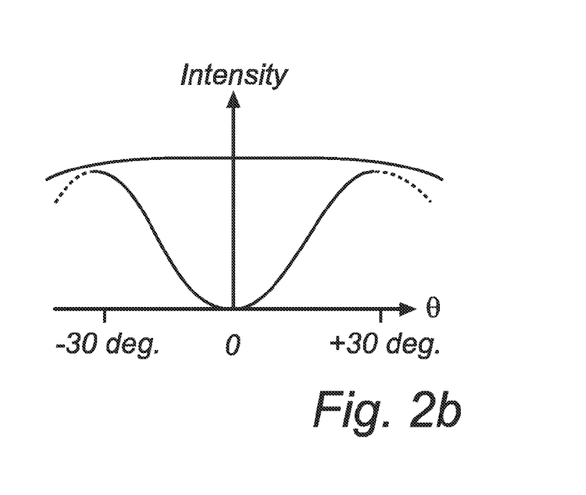

The following description will be based on a dual view display, as an example of a multi view display. A dual view display can be used for automotive applications and can display different images in different directions. An example of an application, shown in FIG. 1, is a dual view display 1 presenting one image in the direction of the driver's side 2, and another image in the direction of the passenger's side 3. For example, the display 1 can show a route planner to the car driver, while allowing a passenger to read e-mail, view movies or play games. For safety reasons, the driver is not allowed to see the information presented to the passenger. In a typical automotive application, the viewing zone intended for the driver and passenger should fulfill the requirements denoted in FIG. 2a. From FIG. 2a it is clear that the display should display no information in an angular range $\phi_1$, centered around the normal to the display surface, while displaying a first image in an angular range $\phi_2$, to the left of the normal, and a second image in an angular range $\phi_3$, to the right. FIG. 2b shows a corresponding diagram of intensity as a function of viewing angle, in this case horizontal viewing angle. This function should ideally have a maximum at $\theta=\theta_{view}$ with $\theta_{view}$ typically somewhere between 30° and 40°, and zero intensity at $\theta=0$.

According to the illustrated embodiment of the present invention, the display is based on a light emitting element including an optical cavity, designed to have an emission profile suitable to realize the desired viewing zones. As an example, the optical cavity can be based on OLED technology. The light emitting element can comprise a multitude of individually addressable pixels, to be controlled by a display driver thereby forming the entire display. Alternatively, the light emitting element can act as a backlight in combination with suitable modulation technique (e.g. LCD).

Figure 3:
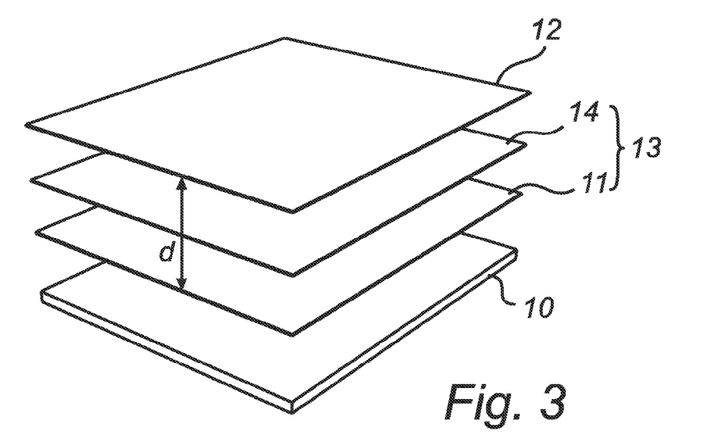
FIG. 3 illustrates schematically an OLED structure.

FIG. 3 shows an exploded view of a basic architecture of an optical cavity comprising a substrate 10, two reflecting surfaces 11, 12 (at least one of which is semi-transparent, to allow light to be emitted from the cavity), and a space 13 in which a light generating layer 14 is arranged. For example, one of the surfaces can be non-transparent and the other semi-transparent. Alternatively, both surfaces are semi-transparent. For clarity the Figure does not show details on pixel-layout and encapsulation.

In this architecture, the interference characteristics of the optical cavity are defined by a number of properties, the most important being the optical distance d between the reflecting surfaces 11, 12, the optical distance $d_1$ between the location of the light generation in layer 14 and the reflecting surface 11 on the non-emitting side of the cavity, and the reflective coefficients $r_1$ and $r_2$ of the two reflecting surfaces.

The optical distances d and $d_1$ are a function of the corresponding physical distances and the refractive indexes of the materials in the space 13. In the simple case where the light emitting material is the only material in the space 13, the optical distances are simply the physical distance multiplied by the refractive index of this material. When several layers of different materials are present, the optical distance becomes a more complex function.

Regarding the distance $d_1$, it is important to note that light typically is generated only in a small fraction of the thickness of the light emitting layer. For example, in case of a pLED, the light emitting layer often has a thickness of about 100 nm, while light is only generated in the "recombination zone".

The reflecting properties of the surfaces 11, 12 can be obtained by using metals or semitransparent conducting films possibly in combination with dielectric overcoats. Often, as shown below in FIG. 4, a light emitting device contains many layers with different refractive indices, and reflection may occur on each interface. Usually, however, on either side of the emission layer, a reflective surface can be identified that is dominant for the optical interference effects in the device.

Figure 4:
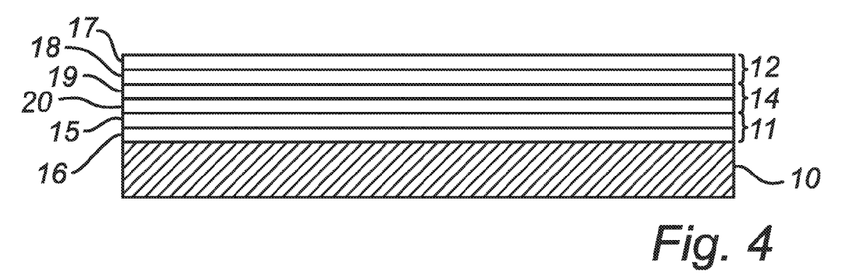
FIG. 4 illustrates an example of an OLED design according to an embodiment of the present invention.

As an example, FIG. 4 shows the design of an OLED based optical cavity, here a pLED stack corresponding to a green emitter in a top-emission pLED. Here, the bottom surface 11 (directly on top of the substrate 10), is a AG reflector 16. The top surface 12 is a 15 nm thick layer 18 of Ag (semitransparent) coated with an electrode formed by a 40 nm thick layer 17 of ZnSe. In the space 13 there between is arranged a 375 nm ITO electrode 15, and the light generating layer 14, comprising an 80 nm thick layer 19 of green LEP and a 200 nm thick PEDOT-layer 21. The thickness of the various layers, in particular the ITO and PEDOT, in the pLED stack have been determined such that the resulting optical cavity demonstrates the desired angular emission profile.

Figure 5:
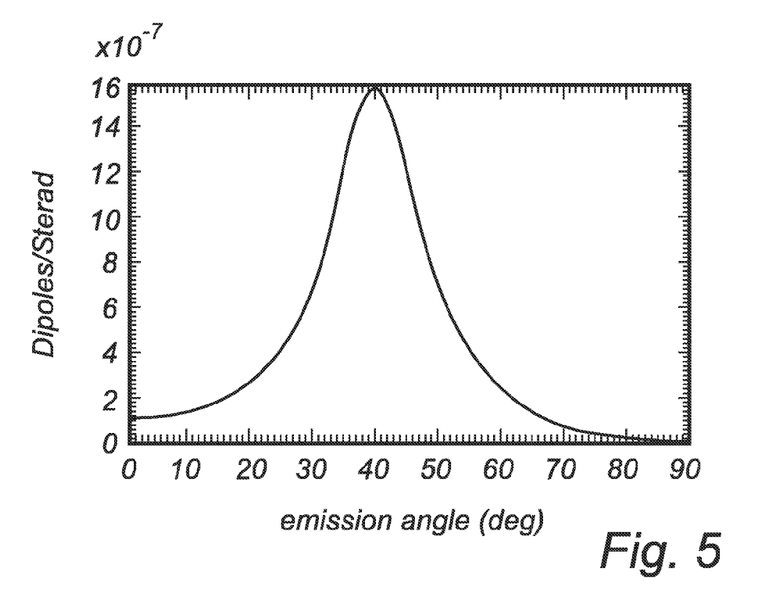
FIG. 5 shows the emission profile from the OLED in FIG. 4.

FIG. 5 shows the calculated angular emission profile from the example stack in FIG. 4. As is clear from FIG. 5, light is mainly emitted under oblique angles (30° to 50°). The calculations are based on the simulation of optical interference effects in a micro-cavity, using the equivalence between quantum mechanical radiative decay rate for the emission of a photon by a dipole transition and the power radiated by a classical elementary dipole antenna. This has been described in e.g. "Simulation of light emission from thin-film micro-cavities", by Kristiaan A. Neyts, J. Opt. Soc. Am. A, Vol 15, no 4, April 1998. In the shown example the ratio between light emitted along the normal and along 30 degrees is 13.

Similarly, the optical cavity of a sub-pixel can be optimized for red and blue emission. In case a display comprises a white-light emitting organic material in combination with a color filter, the sub-pixels can also be optimized to emit light according to the desired angular emission profile.

Figure 6:
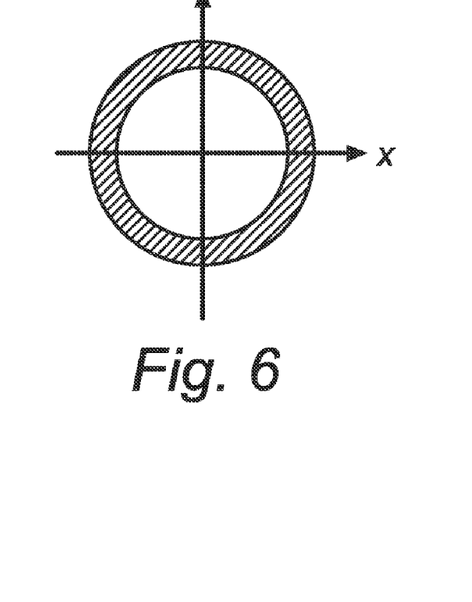
FIG. 6 shows the emission profile projected on an x/y-plane in the far field.

It should be noted that light emission from an OLED is typically circle symmetric. As a consequence, the angular emission profile is obtained for all azimuthal angles, i.e. at a given distance from the origin of light, as illustrated in FIG. 6. An asymmetric diff-using layer can be provided to promote scattering of the light in one direction, while not scattering light in the other direction. An extra barrier can also be provided in order to further split the views.

In the following, some design rules and conditions for achieving the desired cavity modes will be described, with reference to FIGS. 7 to 11.

Figure 7:
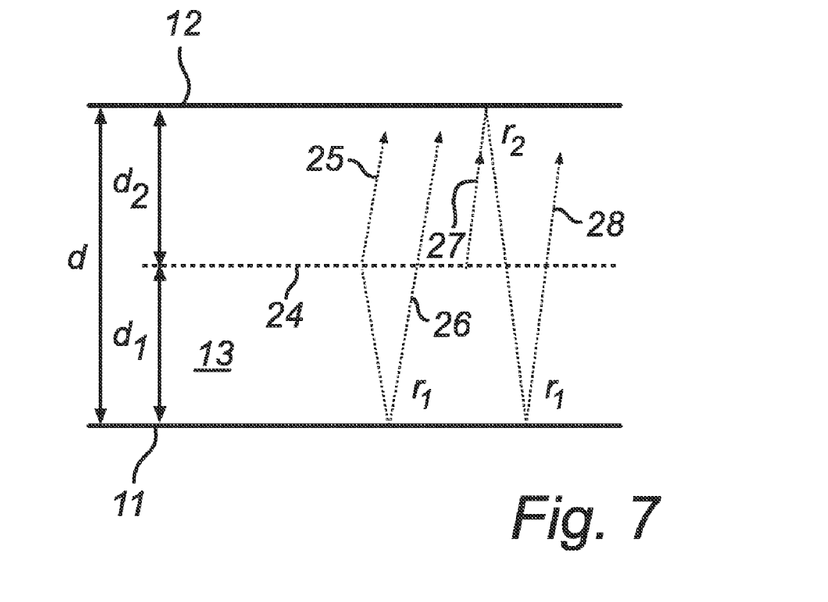
FIG. 7 illustrates resonance in an optical cavity between two reflecting surfaces.

FIG. 7 shows a side view of some parts of the optical cavity in FIG. 3. While reference numerals 11 and 12 have been used as before, reference 24 now indicates the plane of the light emitting layer in which light is generated.

Two types of resonances occur in such an optical cavity: wide-angle resonance and multiple-beam resonance. Here, we will use the term resonance to indicate all constructive interference effects. The resonance will depend on the optical distance d between the reflecting surfaces and the position of the light emitting layer, i.e. the optical distance $d_1$ between the location of light generation in the emission layer and the reflecting surface 11. In the expressions below, it is assumed that that there is only one medium present between the reflecting surfaces 11, 12, making the optical distance equal to the physical distance multiplied by the real part of the refractive index $n_e$ of this material.

Wide-angle resonance is related to interference of light emitted directly in the direction of the viewer (towards the semi-transparent electrode, 12), and light reflected from the opposite reflecting surface (dashed lines 25 and 26 in FIG. 7). The enhancement (or suppression) of the light output depends on the wavelength λ, the optical distance $d_1$, and the viewing angle θ. The resonance condition (maximal enhancement) is $$\phi_1 + 2\pi \frac{2d_1}{\lambda} \cos\theta' = N 2\pi, \quad (1)$$

where $\theta_1$ is the phase shift resulting from the reflection in surface 11, $n_e$ is the (real part of the) refractive index of the medium, and N is an integer. The internal propagation angle θ' is given by Snell's law $$\sin\theta = n_e \sin\theta'. \quad (2)$$

The emission enhancement is minimal when $$\phi_1 + 2\pi \frac{2d_1}{\lambda} \cos\theta' = \left(N + \frac{1}{2}\right) 2\pi. \quad (3)$$

Multiple beam resonance is the result of interference between light resulting from wide-angle interference that is reflected back and forth many times (dashed lines 27 and 28 in FIG. 7). In this case the resonance is dependent on the wavelength λ, the optical distance d, and the viewing angle θ, and the resonance condition (maximum enhancement) is $$\phi_1 + \phi_2 + 2\pi \frac{2d}{\lambda} \cos\theta' = M 2\pi, \quad (4)$$

where M is again an integer, and $\theta_1$ is the phase shift resulting from reflection at the semi-transparent surface 12.

Because typically $-\pi < \theta_1, \theta_2 < 0$, the lowest value for N and M is zero. As mentioned above, if other materials are present between the reflecting surfaces, in addition to the light emitting medium, Eqs. (1), (3) and (4) must be replaced by more complex equivalents, but the resonance phenomena are very similar, and the resonances for a certain λ and θ occur at similar values of the optical thicknesses.

An example of a desired intensity distribution as a function of viewing angle was shown in FIG. 2b. In formulating the design rules, two cases can be discerned: 1) the emission is (virtually) monochromatic; 2) the emission spectrum has a significant width. The former is the ideal case which provides the best control over the light distribution in a dual view display. One rule applies to both cases. For maximum light output, the absolute value of the reflection coefficient $r_1$ at the reflecting surface 11 should be as close to unity as possible (e.g. Ag is a very good reflector). This also allows creation of the lowest possible intensity minimum at θ=0: for $|r_1|=1$ there will be completely destructive interference in the wide-angle resonance minimum.

Monochromatic Emission

In general, it is not possible to have a wide-angle resonance maximum exactly at $\theta=\theta_{view}$ and a minimum exactly at θ=0. It is possible, however, to have a resonance maximum exactly at $\theta=\theta_{view}$ and a minimum close to θ=0, or to have a resonance minimum exactly at θ=0 and a maximum close to $\theta=\theta_{view}$. In both cases the optical distance $d_1$ must be near $$\tilde{d}_1 \approx \frac{\lambda}{4(1 - \cos\theta'_{view})}, \quad (5)$$

where $\theta'_{view}$ is related to $\theta_{view}$ by Snell's law as in Eq. (2). This follows from subtracting Eq. (1) with $\theta'=\theta'_{view}$ from Eq. (3) with θ'=0, and neglecting the small change in $\phi_1$ as a function of θ.

In order to have a resonance maximum exactly at $\theta=\theta_{view}$, an optical distance $d_1$ must be selected that satisfies Eq. (1) with $\theta'=\theta'_{view}$ (N=1, 2, 3, ... ) and is as close to $\tilde{d}_1$ as possible. In order to have a resonance minimum exactly at θ=0, an optical distance $d_1$ must instead be selected that satisfies Eq. (3) with θ'=0, again as close to $\tilde{d}_1$ as possible.

The multiple-beam resonance maximum should coincide with the wide-angle maximum. Thus the optical distance d must be chosen so that Eq. (4) with $\theta'=\theta'_{view}$ is satisfied. Obviously, M≧N, and it has been found that it is advantageous to select M=N.

In practice it may be necessary to allow for certain tolerances, and it has been found that the numerical values of the mentioned parameters (except the integers) can be allowed to deviate from values exactly satisfying the given relationships by around 10%, but preferably not more than around 5%.

Figure 8:
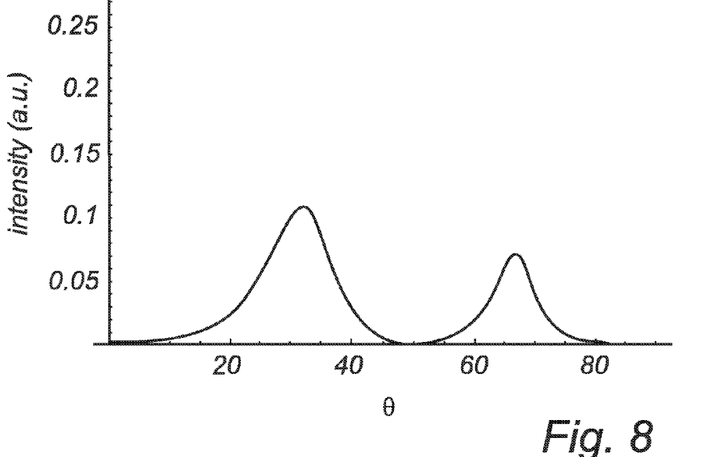
FIG. 8 shows an emission intensity profile for an optical cavity according to a first embodiment of the invention.

FIG. 8 shows an example of an intensity distribution obtained in this manner (with the resonance minimum exactly at θ=0). Silver was used as reflector, the absolute value of the reflection coefficient $r_2$ at the semi-transparent surface 12 was 0.3, and the cavity consisted of green LEP material. The optical distance $d_1$ is about 2400 nm, and M=N.

If the device is optimized as above, there is always a second maximum in the intensity distribution (see FIG. 8). This may be undesirable. Choosing a smaller $d_1$ (smaller N) from the series that satisfies Eq. (1), moves the second maximum to larger θ and eventually eliminates it (see FIG. 9). However, a smaller $d_1$ also means that the resonance minimum is no longer in or near θ=0, resulting in a less favorable ratio of the maximum and minimum of the intensity distribution. To compensate for this, the multiple-beam resonance can be made more strongly peaked around θ=$θ_{view}$. The width of the peak (FWHM) depends on the product $|r_1 r_2|$ and the optical distance d. There are therefore two ways to reduce the width: increase $|r_2|$ and/or increase d. The strength of the reflection at the semi-transparent surface can be tuned, e.g., by varying the thickness of a metal layer or by varying the thickness of a layer with high refractive index adjacent to a metal layer. An additional advantage of a larger $|r_2|$ is a larger resonant intensity enhancement. The width of the multiple-beam resonance should not be made smaller than the desired width of the view. With regard to an increase of d it should be noted that M must not be much larger than N to prevent that multiple-beam resonance produces a visible secondary maximum in the intensity distribution.

Figure 9:
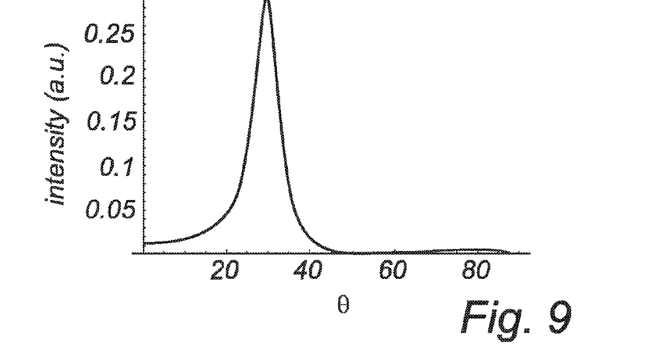
FIG. 9 shows an emission intensity profile for an optical cavity according to a second embodiment of the invention.

FIG. 9 shows the intensity distribution for a device configuration that is similar to that used for FIG. 7, but with an optical distance $d_1$ of about 1500 nm and $|r_2|=0.7$.

Emission with Spectral Distribution

Figure 10:
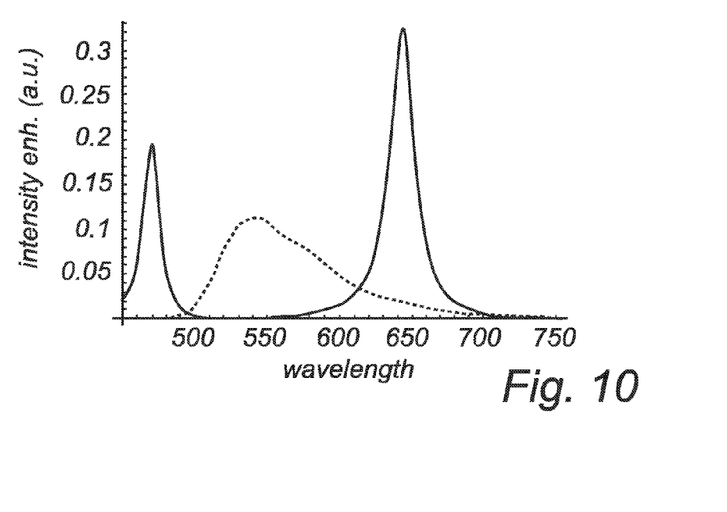
FIG. 10 shows an example of an emission intensity enhancement due to cavity resonances as a function of wavelength, for $\theta=0$.

In this case, the problem should be considered in the wavelength domain. FIG. 10 shows the emission intensity enhancement due to cavity resonances as a function of wavelength, for θ=0. The distance in wavelength between the peaks depends on the optical distance $d_1$: the larger $d_1$, the smaller the distance. This also means that their width (FWHM) in the wavelength domain is reduced. The behavior of wide-angle and multiple-beam resonances is similar. The wavelength positions of the resonance maxima shift with viewing angle.

Let $\lambda_{max}(\theta)$ denote the wavelength corresponding to a certain resonance maximum (wide-angle with given $d_1$ and N or multiple-beam with given d and M). If the cavity contains only the light emitting medium and the dependence of $\theta_1$ and $\theta_2$ on θ are neglected, it follows from Eqs. (1) and (4) that $$\lambda_{max}(\theta)=\lambda_{max}(\theta)\cos\theta'. \quad (6)$$

Thus the resonance maxima shift by $$\Delta\lambda_{max}=\lambda_{max}(\theta)(1-\cos\theta'_{view}) \quad (7)$$

to lower wavelengths if the viewing angle increases to $\theta_{view}$.

FIG. 10 also shows, as an example, the spectrum of a green LEP. The overlap of the resonances with the spectrum determines the intensity emitted towards viewer. For dual-view displays the overlap should be minimal at θ=0, and to be maximal at θ=$θ_{view}$, when the resonance peaks are shifted as described by Eqs. (6) and (7). This can be best realized if
i: the wavelength distance between the resonance maxima is approximately the same for wide-angle and multiple-beam interference, i.e. if N=M
ii: this distance is at least approximately the width of the spectrum $\Delta_{spec}$. Assuming that the phase shifts $\theta_1$ and $\theta_2$ can be approximated as –π (the value for an ideal mirror) it leads to the requirement $$\frac{600\text{ nm}}{M+2} > \Delta_{spec}, \quad (8)$$

where 600 nm is used as the characteristic value of $\lambda_{max}(0)$ for the relevant resonance.

Let $\lambda_0$ be the wavelength so that the overlap between the spectrum and a typical resonance peak is maximal if the resonance maximum is at $\lambda_0$. It should be clear that, in an optimal device, the optical thickness d must be chosen so that $\lambda_{max}(\theta_{view})$ for the relevant resonance is near $\lambda_0$. We refer to $\lambda_0$ as the dominant wavelength in this context.

The ratio of the emitted intensities at θ=$θ_{view}$ and θ=0 is further optimized if the shift $\Delta\lambda_{max}$ is at least the high-wavelength half-width $\Delta_{spec}^+$ of the spectrum (the wavelength distance between the maximum and high-wavelength edge of spectrum). For a cavity filled primarily with LEP material, $\Delta\lambda_{max}$ will typically be much smaller than $\Delta_{spec}^+$. It can be increased by including a low-n layer in the cavity. Low-n here means that the material is transparent in the visible spectrum and has a refractive index $n_1$ with Re $n_1$<1.4 for at least a part of the visible spectrum. The low-n layer is added to the layers in the cavity that are needed for operation of the device and typically have refractive index n>1.4. The increased shift is the result of the relatively small propagation angle θ' in the high-n material, as defined by Eq. (3) (with $n_e$ replaced by $n_1$). It is favorable to give the required layers their minimum thickness, so that the low-n layer is as dominant for the average θ' as possible. The upper limit for the shift is given by $$750\text{ nm }(1-\cos\theta_{view}), \quad (9)$$

where 750 nm has been used as limit for $\lambda_{max}(0)$. It follows from assuming n=1 in the entire cavity.

The optical thickness d corresponding to M-values satisfying Eq. (8) may be too small to allow inclusion of enough low-n material to significantly increase $\Delta\lambda_{max}$. For a wide spectrum (as the example in FIG. 10) a slightly higher M may give a better intensity ratio. Note that higher M means a larger d and thus: 1) more low-n material, and larger $\Delta\lambda_{max}$; 2) a smaller resonance width. A smaller resonance width better reflects the difference between the spectral densities at the wavelengths $\lambda_{max}(\theta_{view})$ and $\lambda_{max}(0)$ in the intensity ratio.

Because the FWHM of a multiple-beam resonance depends on the product $|r_1 r_2|$, it can be tuned with the reflection coefficient at the semi-transparent surface (remember that $|r_1|$ should always be large). A larger $|r_2|$ gives a narrower resonance and thus a better intensity ratio. A drawback is a lower maximum intensity because the maximum overlap between spectrum and resonance is reduced.

The resonance maxima occur at slightly different wavelengths for the two polarizations TE and TM. A complete optimization must therefore be a compromise that takes both contributions into account.

Figure 11:
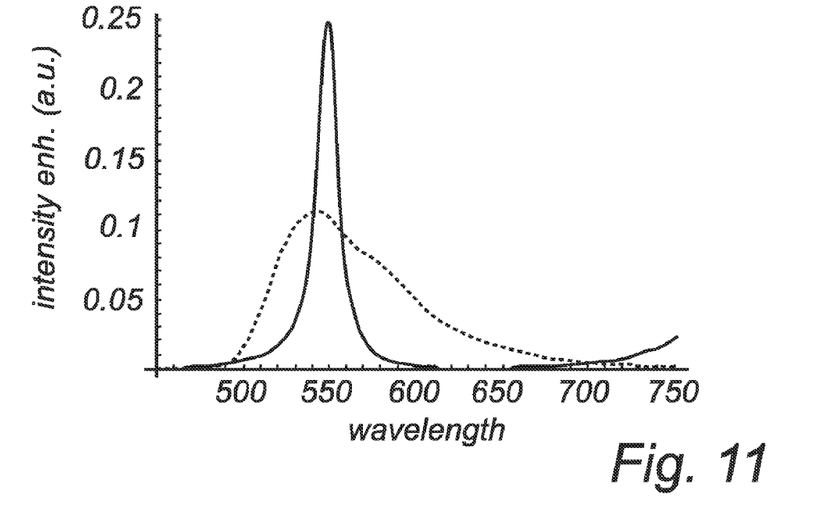
FIG. 11 shows an example of an emission intensity enhancement due to cavity resonances as a function of wavelength, for $\theta=\theta_{view}$.
Figure 12:
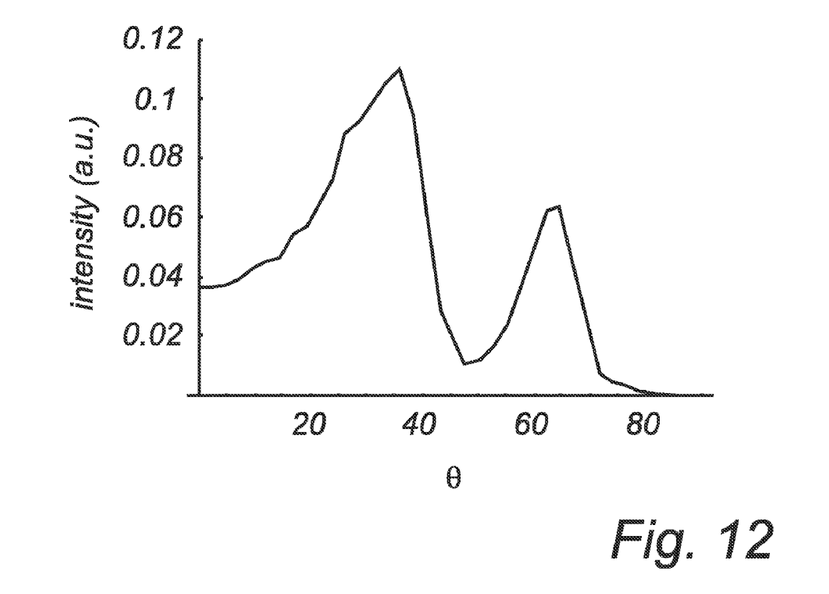
FIG. 12 shows an emission intensity profile for an optical cavity according to a third embodiment of the invention.

The intensity enhancement shown in FIG. 10 is for a device configuration with an optical thickness d of about 850 nm of which 650 nm is low-n material, N=M=2, and $|r_2|=0.7$. It shows the situation for TE polarization and θ=0. The corresponding enhancement profile for θ=$θ_{view}$ is shown in FIG. 11. Here the overlap between the resonance peaks and the green-LEP spectrum is maximal. The resulting intensity profile as a function of viewing angle is plotted in FIG. 12. In this profile both TE and TM polarization are taken into account. Reduction of the low-n layer to about 350 nm (the total optical thickness d is then about 550 nm and N=M=1) increases the distance between the resonance peaks and therefore allows suppression of the second maximum near 65° in the intensity profile. The smaller shift $\Delta\lambda_{max}$ and wider resonance peaks, however, give a smaller intensity ratio. An advantage of the wider resonance is the higher maximum intensity. The spectrum of a green LEP that was used in the examples, has a long tail of the high-wavelength end. The spectra of small-molecule OLEDs are typically narrower and allow a better intensity ratio.

When the resonances shift with viewing angle, different parts of the spectrum are emphasized. This means that the reduction of the intensity is accompanied by a change in the color of the emitted light. This can be suppressed by color filters, which are known per se.

The person skilled in the art realizes that the present invention by no means is limited to the preferred embodiments described above. On the contrary, many modifications and variations are possible within the scope of the appended claims. For example, it should be noted that there are many different OLED architectures that comprise an optical cavity and, therefore, can be tuned to emit light according to the desired angular emission profile. Moreover, both small-molecule and polymer based organics can be used for light generation. In order to further improve the ratio between light along the normal and along an oblique angle, a barrier can also be introduced to block all undesired light, for instance along the normal of the display. Examples of such a barrier are known per se.

The invention claimed is:

1. A multi view display comprising a light emitting element, comprising:
   an optical cavity formed by:
      a first and a second reflecting layer, at least said second reflecting layer being semi-transparent said first reflecting layer having a reflective coefficient ($r_1$) and said second reflective layer is semi-transparent having a reflective coefficient ($r_2$), and
   a light emitting layer arranged between said reflecting layers, said optical cavity being configured so that a resonance of light emitted by the light emitting layer causes said light to be emitted in at least two preferred viewing directions through the second reflecting layer, the at least two preferred viewing directions being at an oblique viewing angle on both sides of an axis normal to the optical cavity, wherein the light in the two preferred viewing directions has a higher intensity than light emitted in other directions, wherein an optical distance, d, between the first and second reflective layers is chosen so that a wavelength corresponding to a resonance maximum at the viewing angle is near a dominant wavelength $\lambda_o$ of the emitted light and an optical distance $d_1$ between a location of light generation in the light emitting layer and said first reflecting layer is on the order of:

$$\frac{\lambda}{4(1-\cos\theta'_{view})}$$

where $\lambda$ is the wavelength of the emitted light, and $\theta'_{view}$ is an internal propagation angle corresponding to the viewing angle $\theta_{view}$, and
   a width of the emitted light in the viewing direction is determined based on a product of the reflective coefficients of the reflecting layers ($/r_1r_2/$) and optical distance d.

2. A multi view display according to claim 1, wherein said light emitting layer comprises an electroluminescent material.

3. A multi view display according to claim 1 wherein said light emitting element is an organic light emitting diode (OLED).

4. A multi view display according to claim 1 wherein a ratio between light intensity emitted along said normal and light intensity emitted on both sides of said normal and at the viewing angle $(\theta)_{view}$ with respect to said normal, exceeds 2.

5. A multi view display according to claim 4, wherein emitted light intensity as a function of viewing angle has a maximum in a direction close to said viewing angle, and a minimum in a direction close to the normal direction.

6. A multi view display according to claim 1 wherein the optical distance d between the reflecting surfaces, the dominant wavelength $\lambda_o$ of the emitted light, phase shifts $\Phi_1$ and $\Phi_2$ resulting from reflection in the first and second reflecting layers, the internal propagation angle $\theta'_{view}$ corresponding to the viewing angle $\theta_{view}$ and an integer M satisfies:

$$\phi_1 + \phi_2 + 2\pi\frac{2d}{\lambda}\cos\theta'_{view} = M2\pi.$$

7. A multi view display according to claim 6,
wherein an emission enhancement is maximum when the optical distance $d_1$ between a location of light generation in the light emitting layer and said first reflecting surface and an integer $N \leq M$ satisfies $$\phi_1 + 2\pi\frac{2d_1}{\lambda}\cos\theta'_{view} = N2\pi.$$

8. A multi view display according to claim 7,
wherein the emission enhancement is minimal when the optical distance $d_1$ between a location of light generation in the light emitting layer (14) and said first reflecting surface and an integer $N \leq M$ satisfy $$\phi_1 + 2\pi\frac{2d_1}{\lambda} = \left(N + \frac{1}{2}\right)2\pi.$$

9. A multi view display according to claim 7, wherein N is chosen so that the optical distance $d_1$ is on the order of $$\frac{\lambda}{4(1-\cos\theta'_{view})}$$

10. A multi view display according to claim 6, wherein said expression is satisfied if numeric values of the included variables deviate from values for which the expression holds exactly, by no more than 10%.

11. A multi view display according to claim 7, wherein M=N.

12. A multi view display according to claim 1, wherein said optical cavity further includes at least one layer having an index of refraction ($n_e$) with a real part lower than 1.5.

13. A multi view display according to claim 1, wherein the reflective coefficient $r_2$ is larger than 0.5.

14. A multi view display according to claim 1, wherein the reflective coefficient ($r_1$) is substantially equal to one.

15. A multi view display according to claim 1, wherein said light emitting material is adapted to emit light within a wavelength range (LA) less than 100 nm.

16. A multi view display according to claim 15, wherein said light emitting material is adapted to emit monochromatic light.

17. A multi view display according to claim 1, further comprising an asymmetric diffuser arranged between the optical cavity and the viewer, said asymmetric diffuser being adapted to scatter light essentially only in one direction.

18. A multi view display according to claim 1, wherein said light emitting element is adapted to act as a backlight, and wherein the display further comprises a light modulating panel for modulating light emitted from said backlight.

19. A multi view display according to claim 1, wherein said light emitting element is constructed with a patterned pixel structure to form an addressable light emitting panel controllable by a display driver.

20. A multi view display comprising a light emitting element and an asymmetric diffuser arranged between the light emitting element and a viewer, said light emitting element comprising:
   an optical cavity formed by:
      a first and a second reflecting layer, at least said second reflecting layer being semi-transparent said first reflecting layer having a reflective coefficient ($r_1$) and said second reflecting layer having a reflective coefficient ($r_2$), and
      a light emitting layer arranged between said reflecting layers, wherein said optical cavity is configured so that a resonance of light emitted by the light emitting layer causes said light to be emitted in at least two preferred directions through the second reflecting layer, the viewing directions being at an oblique viewing angle on both sides of an axis normal to the optical cavity, wherein the light in the two preferred viewing directions has a higher intensity than light emitted in other directions, wherein an optical distance, d, between the first and second reflecting layers is chosen so that a wavelength corresponding to a resonance maximum at the viewing angle is near a dominant wavelength $\lambda_o$ of the emitted light and an optical distance $d_1$ between a location of light generation in the light emitting layer and said first reflecting layer is on the order of:

$$\frac{\lambda}{4(1 - \cos\theta'_{view})}$$

where $\lambda$ is the wavelength of the emitted light, and
   $\theta'_{view}$ is an internal propagation angle corresponding to the viewing angle $\theta_{view}$; and
a width of the emitted light in the viewing direction is determined as based on a product of the reflective coefficients of the reflecting layers ($/r_1r_2/$) and optical distance d.

21. A multi view display according to claim 20, wherein said asymmetric diffuser is adapted to scatter light essentially only in one direction.

22. A multi view display according to claim 21, wherein said asymmetric diffuser is adapted to scatter light in a direction essentially perpendicular to the angular spread of the multiple views of the display.

* * * * *